United States Patent [19]
Mori

[11] Patent Number: 4,616,402
[45] Date of Patent: Oct. 14, 1986

[54] METHOD OF MANUFACTURING A SEMICONDUCTOR DEVICE WITH A STACKED-GATE-ELECTRODE STRUCTURE

[75] Inventor: Seiichi Mori, Tokyo, Japan
[73] Assignee: Kabushiki Kaisha Toshiba, Japan
[21] Appl. No.: 729,660
[22] Filed: May 2, 1985

[30] Foreign Application Priority Data

May 7, 1984 [JP] Japan .................................. 59-90414

[51] Int. Cl.$^4$ .............................................. H01L 21/26
[52] U.S. Cl. .................................. 29/571; 29/576 W; 29/578; 148/DIG. 156
[58] Field of Search ..................... 29/571, 576 W, 576, 29/578; 148/DIG. 156; 357/23.5, 54; 365/185

[56] References Cited

U.S. PATENT DOCUMENTS

| | | | |
|---|---|---|---|
| 4,407,696 | 10/1983 | Han et al. | 29/576 W |
| 4,412,310 | 10/1983 | Korsh et al. | 365/185 |
| 4,426,764 | 1/1984 | Kosa et al. | 29/571 |
| 4,495,693 | 1/1985 | Iwahashi et al. | 29/571 |
| 4,512,074 | 4/1985 | Sasaki | 29/576 W |
| 4,517,732 | 5/1985 | Oshikawa | 29/571 |

OTHER PUBLICATIONS

Jacobs et al., "n-Channel Sc-Gate Process for MNOS EEPROM Transistors," Solid State Electronics, vol. 24, pp. 517–522 (1981).
Chen, "Threshold–Alternable Si–Gate MOS Devices", IEEE Transactions Electron Dev., vol. ED-24, No. 5, May 1977.

Primary Examiner—Brian E. Hearn
Assistant Examiner—Hunter L. Auyang
Attorney, Agent, or Firm—Finnegan, Henderson, Farabow, Garrett, & Dunner

[57] ABSTRACT

A method of manufacturing a semiconductor device with a stacked-gate-electrode structure which includes; forming source and drain regions in the surface portion of a semiconductor substrate in a spaced-apart relationship, forming a floating gate such that it overlies the channel region between the source and drain regions with a gate insulating film therebetween, and forming a control gate such that it overlies the floating gate with an insulating film therebetween. An oxidation-resistant film pattern having a predetermined opening is formed over a non-monocrystalline silicon layer. The non-monocrystalline silicon layer within the opening is selectively oxidized with the oxidation-resistant film pattern as a mask to form a separation insulating film. In this way, a floating gate layer is formed with the portion of the non-monocrystalline silicon layer insulatingly separated. With the oxidation-resistant film pattern left over the floating gate layer and with the separation insulating film left within the opening, a control gate layer is formed over the surface of the resultant surface to permit the whole surface of the resultant surface to be planarized.

14 Claims, 7 Drawing Figures

METHOD OF MANUFACTURING A SEMICONDUCTOR DEVICE WITH A STACKED-GATE-ELECTRODE STRUCTURE

BACKGROUND OF THE INVENTION

This invention relates to a method of manufacturing a semiconductor device and, in particular, a method of manufacturing a semiconductor device having a stacked-gate-electrode structure.

An EPROM (Erasable Programmable Read Only Memory) includes a two-layered gate electrode structure: a floating gate and control gate. Conventionally, the floating gate is formed by etching a polycrystalline silicon layer which is formed on a first gate insulating film. In this connection it is to be noted that an opening is formed by an etching step in the polycrystalline silicon layer. At the same time, there occur cases where protruding ends are formed on the polycrystalline silicon layer. Thereafter, a conductive layer is so formed that it overlies the etched polycrystalline silicon layer with a second gate insulating film therebetween. In this way, a control gate is formed.

According to the conventional method, there occur cases where no such second gate insulating film of an adequate thickness is formed at the ends of the opening and thus the critical field strength of the second gate insulating film is lowered. Furthermore, if the end of the etched polycrystalline silicon layer protrudes, an electric field is concentrated there, thus lowering the critical field strength of the second gate insulating film. If the conductive layer is formed at the location of the opening, there is disadvantage that a breakage occurs at the stepped portion of the opening. This phenomenon prominently occurs if the conductive layer, in particular, is formed of, for example, a metal layer having a high melting point, a layer of a silicide of the metal having high melting point or a polycide layer (i.e., a two-layered structure comprised of a polycrystalline silicon layer and a layer of a silicide of the metal having a high melting point).

U.S. Pat. No. 4,412,310 to George J. Korsh et al. discloses the process of forming an oxide layer between a floating gate and an overlying control gate, in which the oxide layer is thicker at the edges of the floating gate than in the central portion thereof. According to this invention, however, the above-mentioned problem is solved by another method.

SUMMARY OF THE INVENTION

It is accordingly an object of this invention to provide a method of manufacturing a semiconductor device with a stacked-gate-electrode structure, which can improve critical field strength across gate electrodes and can prevent a breakage in the stepped portion of two or more gate electrodes.

To attain the above-mentioned advantage, there is provided a method of manufacturing a semiconductor device which comprises the steps of forming source and drain regions in the surface portion of a semiconductor substrate in a spaced-apart relation, forming a floating gate such that it overlies a channel region between the source and drain regions with a gate insulating film formed therebetween and forming a control gate such that it overlies the floating gate with an insulating film formed between the control gate and the floating gate, the improvement further comprising the steps of forming an oxidation-resistant film pattern having a predetermined opening over a non-monocrystalline silicon layer, forming a floating gate layer by selectively oxidizing the non-monocrystalline silicon layer within the predetermined opening with the oxidation-resistant film pattern as a mask to form a separation insulating film with a portion of the non-monocrystalline silicon layer insulatingly separated therefrom, and forming the control gate formation layer over the resultant structure with the oxidation-resistant film pattern left over the floating gate layer and with the separation insulating film left within the opening to permit the surface of the resultant structure to be planarized.

In the method of this invention, since an oxidation-resistant pattern of, for example, $Si_3N_4$, which has been used as a mask, is used also as a gate insulating film, it is possible to improve the critical field strength of a gate insulating film. Furthermore, the non-monocrystalline silicon layer is selectively oxidized to form the floating gate layer with the portion of the non-monocrystalline silicon layer insulatingly separated, reducing the stepped portion of the control gate layer and thus preventing a breakage at that stepped portion. The end of the floating gate is smoothly formed due to the selective oxidation, preventing an electric field from being concentrated at the end of the floating gate.

BRIEF DESCRIPTION OF THE DRAWINGS

The other objects and advantages will be apparent from the following description taken in conjunction with the accompanying drawings in which.

DETAILED DESCRIPTION OF THE PREFERRED EMBODIMENT

The method of manufacturing an EPROM according to this invention will be explained below by referring to FIGS. 1A to 1E, 2 and 3.

Figure 1A:
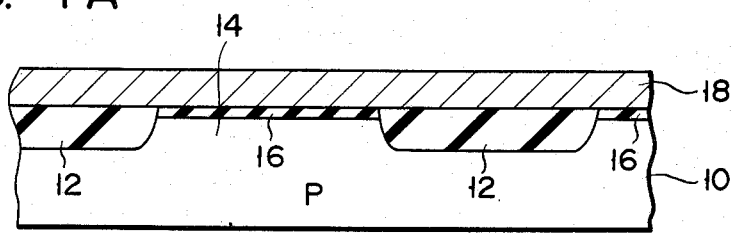
FIGS. 1A to 1E are cross-sectional views for explaining a method of manufacturing a semiconductor device according to a first embodiment of this invention.

As shown in FIG. 1A, an element separation area 12 is formed by a well known technique on the surface portion of a p type silicon substrate 10 and a first gate insulating film 16 is formed by, for example, a thermal oxidation method on a channel region in an island region 14 of the silicon substrate 10 which is surrounded by the element separation area 12. Then, a first polycrystalline silicon layer 18 made of non-monocrystalline silicon is deposited, with a thickness of, for example, 0.2 $\mu$m (2000 Å), on the whole surface of the resultant structure and then the silicon layer 18 is heavily doped either by an ion implantation method or by a thermal diffusion method using a $POCl_3$ as a diffusion source, to attain a high concentration level of $3 \times 10^{20}$ to $8 \times 10^{20}/cm^3$. In the thermal diffusion method, heat treatment can be effected in the $POCl_3$ atmosphere for 30 to 70 minutes at 900° C. to 950° C.

Figure 1B:
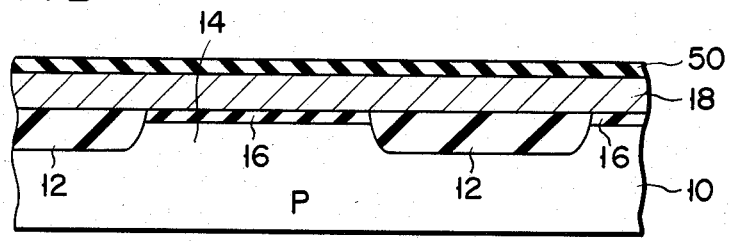
Figure 1C:
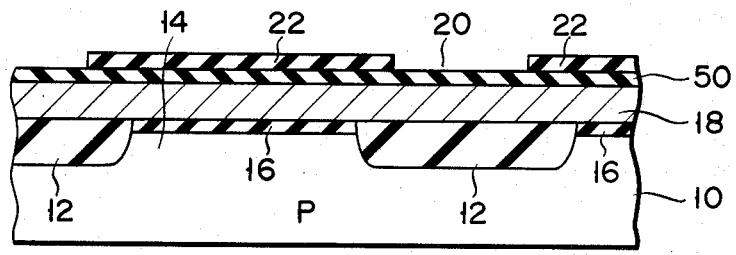

Then, as shown in FIG. 1B, a first silicon oxide film 50 about 20 nm (200 Å) thick is formed on a first polycrystalline silicon layer 18 by adopting a diluted oxygen method at a temperature of, for example, 900° C. to 1100° C. Then, as shown in FIG. 1C, a silicon nitride film about 15 nm (150 Å) thick is formed on the whole surface of the resultant structure by an LPCVD (Low Pressure Chemical Vapor Deposition), a plasma CVD method or thermal nitridation and the silicon nitride film portion overlying a predetermined portion of the element separation area 12 is selectively removed by a photolithography and a RIE method to obtain a silicon nitride film pattern 22 having an opening 20. An area of the opening 20 is smaller than that of the portion of the element separation area 12, as shown in FIG. 1C.

Figure 1D:
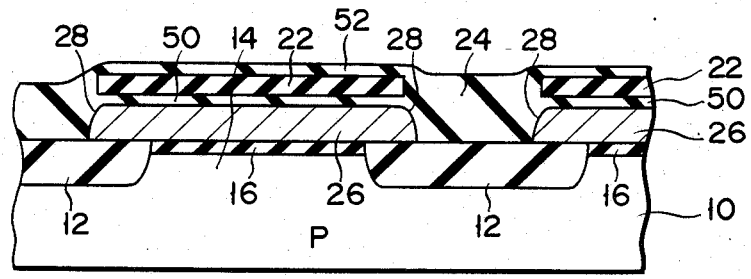

Then, as shown in FIG. 1D, a thermal oxidation step is carried out with a silicon nitride film pattern 22 as a mask, under the condition that the portion of the first polycrystalline silicon layer 18 within the opening 20 of the silicon nitride film pattern 22 is completely oxidized. As a result, the first polycrystalline silicon layer portion below the opening 20 of the silicon nitride film pattern 22 is thermally oxidized to provide a second silicon oxide film 24 and a third silicon oxide film 52 on the silicon nitride film pattern 22. In this way, the whole surface of the silicon substrate 10 is substantially planarized. The remaining unoxidized first polycrystalline silicon layer 18 provides a first polycrystalline silicon layer pattern 26 as a floating gate with its end 28 smoothly formed.

Figure 1E:
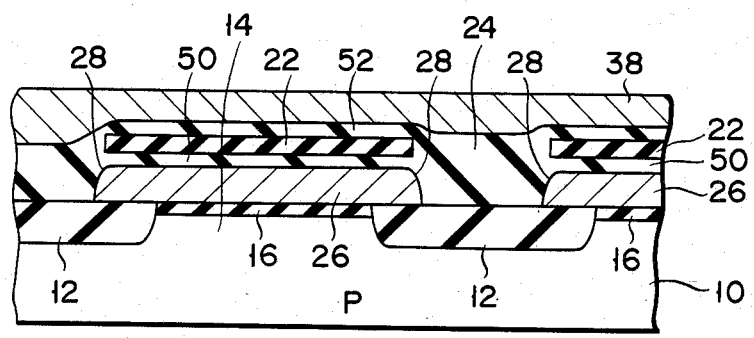
Figure 2:
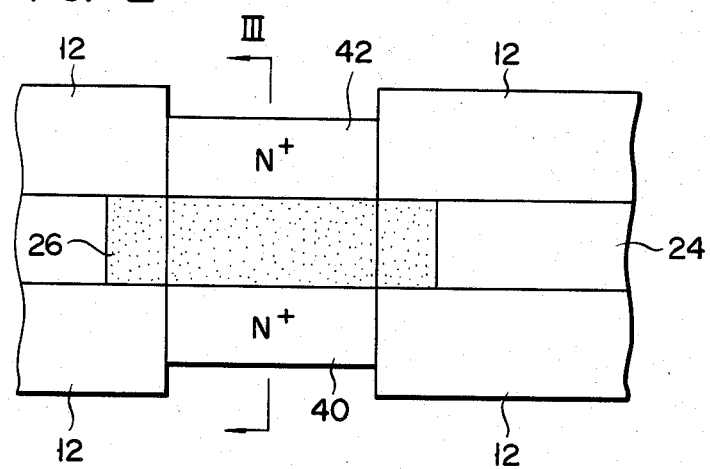
FIG. 2 is a plan view showing a semiconductor device manufactured according to the method of this invention.
Figure 3:
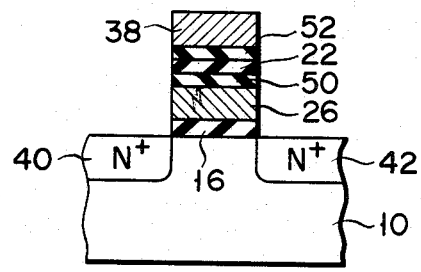
FIG. 3 is a cross-sectional view as taken along line III—III in FIG. 2.

As shown in FIG. 1E, a second polycrystalline silicon layer is deposited on the whole surface of the resultant structure and, after being subjected to a patterning step, provides a control gate 38. Then, with the control gate as a mask an n-type impurity is ion-implanted into the silicon substrate 10 to provide N+ type source and drain regions 40 and 42. An insulating film, though not shown, is formed on the whole surface of the resultant structure and the portions of the insulating film overlying the source and drain regions 40 and 42 are opened to provide corresponding contact holes over which an Al interconnection layer is formed. In this way, an EPROM is fabricated for which reference is invited to FIGS. 2 and 3.

According to this embodiment, since the first polycrystalline silicon layer pattern 26 (left unoxidized at the step of the selective oxidation of the first polycrystalline silicon layer 18) provides the floating gate and since the second silicon oxide film 24 is formed over the opening 20 and the third silicon oxide film 52 is formed on the silicon nitride film pattern 22, it is possible to substantially planarize the whole surface of the device. This specific arrangement can overcome a problem, that is, a reduction in critical field strength between the control gate and the floating gate which may be involved in the conventional method of forming the floating gate by the RIE step. Furthermore, the end 28 of the first polycrystalline silicon layer pattern 26 is convexly and smoothly formed, preventing an electric field from being concentrated there. The three-layered insulating film structure, that is, the first silicon oxide film 50, silicon nitride film pattern 22 and third silicon oxide film 52 are formed between the floating gate 26 and the control gate 38 with the result that the silicon nitride film pattern 22 deposited alleviates a non-uniformity in the film thickness of the first silicon oxide film 50 and has its own high critical field strength. It is therefore possible to improve the critical field strength of the gate insulating film between the floating gate 26 and the control gate 38. It is also possible to obtain a greater capacitance between the floating gate 26 and the control gate 38 due to the presence of the silicon nitride film pattern 22 of a high electric constant or permittivity.

This embodiment can be modified as follows. The control gate 38 may be formed of a metal layer, metal silicide layer or polycide layer, having high melting points. In this case, the whole surface of the semiconductor device can be substantially planarized, prominently avoiding any possible breakage in the stepped portion of the control gate.

As a gate insulating film between the floating gate 26 and the control gate 38 use may be made of a silicon nitride film pattern 22 only, or a two-layered structure comprised of the silicon oxide film (50 or 53) and silicon nitride film pattern. The floating gate is not restricted to the polycrystalline silicon layer and may be formed an amorphous semiconductor layer.

Although this embodiment has been explained as being applied to the EPROM, it is not restricted thereto. This invention is also applicable to the manufacture of a semiconductor device having two or more gate electrodes.

What is claimed is:

1. A method of manufacturing a semiconductor device with a stacked-gate-electrode structure, comprising the steps of:

forming an element separation area in the surface portion of a semiconductor substrate;

forming a gate insulating film on an island region of said semiconductor substrate surrounded by the element separation area;

forming a non-monocrystalline silicon layer on the whole surface of the resultant structure;

forming over the non-monocrystalline silicon layer an oxidation-resistant film pattern having an opening at a portion thereof corresponding to a portion of the element separation area, an area of said opening being smaller than that of said portion of the element separation area;

forming a first gate electrode by selectively oxidizing a non-monocrystalline silicon layer within the opening with the oxidation-resistant film pattern as a mask to form a separation insulating film with a portion of the non-monocrystalline silicon layer insulatingly separated; and forming, with said oxidation-resistant film pattern left over the first gate electrode and with said separation insulating film left within the opening, a second gate electrode over the surface of the resultant structure to permit the whole surface of the resultant structure to be planarized.

2. A method according to claim 1, in which said oxidation-resistant film pattern is a silicon nitride film pattern.

3. A method according to claim 1, further comprising the steps of heavily doping an impurity into the non-monocrystalline silicon layer before said non-monocrystalline silicon layer is selectively oxidized.

4. A method according to claim 3, in which phosphorus is heavily doped, as the impurity, in the order of $3 \times 10^{20}$ to $8 \times 10^{20}/cm^3$.

5. A method according to claim 1, in which said non-monocrystalline silicon layer is a polycrystalline silicon layer or an amorphous silicon layer.

6. A method according to claim 1, in which said second gate electrode is formed of a silicide of a metal having a high melting point.

7. A method according to claim 1, in which said second gate electrode is made of a polycide layer.

8. A method according to claim 1, in which said oxidation-resistant film pattern is formed so as to overlie said non-monocrystalline silicon layer with an insulating film therebetween.

9. A method according to claim 8, in which said oxidation-resistant film pattern is a silicon nitride film pattern.

10. A method according to claim 8, further comprising the step of heavily doping an impurity into said non-monocrystalline silicon layer before said non-monocrystalline silicon layer is selectively oxidized.

11. A method according to claim 10, in which phosphor is heavily doped, as said impurity, in the order of $3 \times 10^{20}$ to $8 \times 10^{20}/cm^3$.

12. A method according to claim 8, in which said non-monocrystalline silicon layer is a polycrystalline silicon layer or an amorphous silicon layer.

13. A method according to claim 8, in which said second gate electrode is formed of a metal having a high melting point or a silicide of said metal.

14. A method according to claim 8, in which said second gate electrode is formed of a polycide layer.

* * * * *